(12) United States Patent
Werking

(10) Patent No.: US 10,277,180 B2
(45) Date of Patent: Apr. 30, 2019

(54) DUAL PORT TRANSIMPEDANCE AMPLIFIER WITH SEPARATE FEEDBACK

(71) Applicant: Honeywell International Inc., Morris Plains, NJ (US)

(72) Inventor: Paul M. Werking, Rockford, MN (US)

(73) Assignee: Honeywell International Inc., Morris Plains, NJ (US)

( * ) Notice: Subject to any disclaimer, the term of this patent is extended or adjusted under 35 U.S.C. 154(b) by 239 days.

(21) Appl. No.: 15/234,978

(22) Filed: Aug. 11, 2016

(65) Prior Publication Data

US 2017/0207760 A1   Jul. 20, 2017

Related U.S. Application Data

(60) Provisional application No. 62/279,545, filed on Jan. 15, 2016.

(51) Int. Cl.
| | |
|---|---|
| *H03F 3/08* | (2006.01) |
| *H03F 3/45* | (2006.01) |
| *G01P 15/125* | (2006.01) |
| *H03F 1/34* | (2006.01) |

(Continued)

(52) U.S. Cl.
CPC ........ *H03F 3/45475* (2013.01); *G01P 15/125* (2013.01); *H03F 1/34* (2013.01); *H03F 3/08* (2013.01); *H03F 3/45* (2013.01); *H03F 2203/45288* (2013.01); *H04R 3/00* (2013.01); *H04R 19/04* (2013.01); *H04R 2201/003* (2013.01)

(58) Field of Classification Search
CPC ... H03F 3/08; H03F 3/04; H03F 3/085; H03F 3/087; H03F 17/00; H03F 1/34; H03F 3/082; H03F 1/36; H03G 1/0047; H03G 3/3084; H03G 11/02; H03G 11/002
USPC ................................. 330/59, 110, 174, 308
See application file for complete search history.

(56) References Cited

U.S. PATENT DOCUMENTS

| | | | |
|---|---|---|---|
| 4,724,315 A | * | 2/1988 | Goerne ............. H04B 10/6933 250/214 A |
| 5,329,115 A | | 7/1994 | Lim |
| 5,606,288 A | | 2/1997 | Prentice |

(Continued)

FOREIGN PATENT DOCUMENTS

| | | |
|---|---|---|
| EP | 0422496 A2 | 10/1990 |
| JP | 2010136169 A | 6/2010 |

(Continued)

OTHER PUBLICATIONS

Response to Examination Report dated Jan. 31, 2018, from counterpart European Patent Application No. 16205581.8, filed on Mar. 6, 2018, 3 pp.

(Continued)

*Primary Examiner* — Khanh V Nguyen
(74) *Attorney, Agent, or Firm* — Shumaker & Sieffert, P.A.

(57) ABSTRACT

A transimpedance amplifier circuit with an AC signal path and a DC bias path separate from the AC signal path that may be used with a wide variety of sensors such as MEMS accelerometers, photo detectors and pressure sensors. The circuit includes a high impedance input pseudo-resistor that minimizes the area needed on an integrated circuit and configured to minimize losses, noise injection, noise gain and distortion while maintaining amplifier bandwidth, linearity and output voltage range.

20 Claims, 14 Drawing Sheets

(51) Int. Cl.
*H04R 19/04* (2006.01)
*H04R 3/00* (2006.01)

(56) References Cited

U.S. PATENT DOCUMENTS

| | | | |
|---|---|---|---|
| 5,640,128 | A | 6/1997 | Wilhelm |
| 5,900,779 | A | 5/1999 | Giacomini |
| 5,982,232 | A | 11/1999 | Rogers |
| 6,028,482 | A | 2/2000 | Herrle |
| 6,242,732 | B1 | 6/2001 | Rantakari |
| 6,252,462 | B1 | 6/2001 | Hoffman |
| 6,359,510 | B1 * | 3/2002 | Ishii .............. H03F 3/45183 330/253 |
| 6,731,121 | B1 | 5/2004 | Hsu et al. |
| 7,126,423 | B1 * | 10/2006 | Kruiskamp .............. H03F 1/34 330/253 |
| 7,183,859 | B2 * | 2/2007 | Visocchi .............. H03F 1/30 250/214 A |
| 7,598,793 | B1 | 10/2009 | Sengupta et al. |
| 7,616,062 | B2 * | 11/2009 | Miyamoto .............. H03F 3/08 250/214 A |
| 7,825,735 | B1 | 11/2010 | Wessendorf |
| 7,944,290 | B2 | 5/2011 | Yeung et al. |
| 8,593,226 | B2 | 11/2013 | Proesel et al. |
| 8,618,816 | B2 | 12/2013 | He et al. |
| 8,618,882 | B2 * | 12/2013 | Forejt .............. H03F 3/45179 330/254 |
| 8,659,340 | B2 | 2/2014 | Shiue et al. |
| 8,981,853 | B2 | 3/2015 | Eyssa et al. |
| 2003/0090326 | A1 | 5/2003 | Pogrebinsky et al. |
| 2007/0071455 | A1 | 3/2007 | Margalit et al. |
| 2008/0007344 | A1 | 1/2008 | Matzke |
| 2013/0141121 | A1 | 6/2013 | Lamesch |
| 2014/0002116 | A1 | 1/2014 | Wuerstlein et al. |
| 2014/0145785 | A1 * | 5/2014 | Bandyopadhyay .............. H03F 3/45475 330/69 |
| 2014/0193164 | A1 | 7/2014 | Ide |
| 2014/0238133 | A1 | 8/2014 | Kishiro |
| 2015/0002221 | A1 * | 1/2015 | Van Helleputte .............. H03F 3/68 330/69 |
| 2015/0301105 | A1 | 10/2015 | Lamesch |

FOREIGN PATENT DOCUMENTS

| | | |
|---|---|---|
| JP | 2015128249 A | 7/2015 |
| WO | 2014166780 A1 | 10/2014 |

OTHER PUBLICATIONS

Extended European Search Report from counterpart European Application No. 16205581.8, dated May 16, 2017, 7 pp.
Chaddad, "Low-Noise Front-End Receiver Dedicated to Biomedical Devices: NIRS Acquisition System," Circuits and Systems, vol. 5, No. 8, Aug. 2, 2014, pp. 191-200.
Zou et al., "A 1-V 450-nW Fully Integrated Programmable Biomedical Sensor Interface Chip," IEEE Journal of Solid-State Circuits, vol. 44, No. 4, Apr. 2009, pp. 1067-1077.
Tajalli et al., "Implementing ultra-high-value floating tunable CMOS resistors," Electronics Letters, vol. 44, No. 5, Feb. 28, 2008, 2 pp.
Nolan et al., "Demystifying Auto-Zero Amplifiers," Analog Dialogue, vol. 34, 2000, pp. 25-29 (Applicant points out, in accordance with MPEP 609.04(a), that the year of publication, 2000, is sufficiently earlier than the effective U.S. filing late, Jan. 15, 2016 so that the particular month of publication is not in issue.).
"Active Low Pass Filter," Electronic Tutorials, retrieved from http://www.electronics-tutorials.ws/filter/filter_5.html on Jun. 8, 2016, 12 pp.
"Clamper (electronics," Wikipedia, the free encyclopedia, retrieved from https://en.wikipedia.org/w/index.php?title=Clamper_(electronics) &oldid=713670231, Apr. 5, 2016, 4 pp.
"Clamper Circuits, Chapter 3—Diodes and Rectifiers," Lessons in Electric Circuits, vol. 3, retrieved from http://www.allaboutcircuits.com/textbook/semiconductors/chpt-3/clamper-circuits/, Apr. 5, 2009, 4 pp.
"DC Restoration," retrieved from http://www.falstad.com/circuit/e-dcrestoration.html, Jun. 9, 2015, 1 pp.
"State Variable Filter," Electronic Tutorials, retrieved from http://www.electronics-tutorials.ws/filter/state-variable-filter.html on Jun. 8, 2016, 14 pp.
"State Variable Filter Design Equations," Daycounter, Inc., retrieved from http://www.daycounter.com/Filters/StateVariableFilters/State-Variable-Filter-Design-Equations.phtml on Jun. 8, 2016, 2 pp.
Azin et al., "A Battery-Powered Activity-Dependent Intracortical Microstimulation IC for Brain-Machine-Brain Interface," IEEE Journal of Solid-State Circuits, vol. 46, No. 4, Apr. 2011, pp. 731-745.
Response to Extended European Search Report dated May 16, 2017, from counterpart European Patent Application No. 16205581.8, filed on Sep. 13, 2017, 19 pp.
Communication pursuant to Article 94(3) EPC, from counterpart European Patent Application No. 16205581.8, dated Jan. 31, 2018, 5 pp.
Intent to Grant from counterpart European Patent Application No. 16205581.8, dated Jul. 13, 2018, 78 pp.

* cited by examiner

DUAL PORT TRANSIMPEDANCE AMPLIFIER WITH SEPARATE FEEDBACK

This Application claims the benefit of U.S. Provisional Patent Application 62/279,545, filed 15 Jan. 2016, the entire content of which is incorporated herein by reference.

TECHNICAL FIELD

This disclosure relates to transimpedance amplifiers.

BACKGROUND

Transimpedance amplifier (TIA) circuits are used to interface with a wide variety of sensors. Such applications include, but are not limited to, microelectronic and microelectromechanical systems (MEMS) accelerometers, MEMS gyroscopes, photo detectors, pressure sensors, and ionization chambers. Transimpedance amplifiers are also known as current-to-voltage converters.

SUMMARY

In general, the disclosure is directed to a transimpedance amplifier (TIA) circuit that includes an AC signal path and a DC bias path separate from the AC signal path. In one example, this disclosure is directed to a transimpedance amplifier circuit comprising: a first and second input pins; one or more output pins; an AC signal path that connects the first input pin to the one or more output pins; an input resistor that connects the first input pin to a ground; and a DC bias path separate from the AC signal path that connects the second input pin to the one or more output pins.

In a second example, this disclosure is directed to transimpedance amplifier circuit comprising: an amplifier comprising: a first positive input pin and a second positive input pin, a first negative input pin and a second negative input pin, at least one positive output pin, at least one negative output pin, and an input to set common mode output voltage; and an AC signal path, wherein the AC signal path connects the first negative input pin to the at least one positive output pin.

The details of one or more examples are set forth in the accompanying drawings and the description below. Other features, objects, and advantages will be apparent from the description and drawings, and from the claims.

DETAILED DESCRIPTION

A transimpedance amplifier (TIA) circuit configured in accordance with the techniques of this disclosure may include an alternating current (AC) signal path separate from a direct current (DC) bias path. A TIA circuit with this configuration may operate with high linearity, low signal distortion, and require only a small area when implemented on an integrated circuit (IC). Additionally, in some examples, these TIA circuits may operate using only a single supply voltage and may be used to amplify signals from either single output or differential output capacitive sensors.

TIA circuits used in AC coupled circuits, in accordance with this disclosure, may use very high (e.g. greater than 22 MΩ) impedance resistors to minimize losses and noise injection, without requiring expensive, external giga-ohm sized resistors, or using large on-chip resistors that may take up a large surface area on an IC. Large surface area resistors on an IC may have significant parasitic capacitance, which may be undesirable for an amplifier. Instead, TIA circuits according to this disclosure may use pseudo-resistors to achieve high impedance with low surface area and low parasitic capacitance. In some examples, TIA circuits described in this disclosure may include a high impedance pseudo resistor at the input to achieve high gain, while avoiding both limiting the output voltage and amplifier distortion found in TIA circuits that use pseudo resistors in the feedback path. In this way, TIA circuits configured with an AC signal path separate from a DC bias path in accordance with this disclosure may amplify a wide variety of sensor signals while controlling the output offset voltage, minimizing output noise in the signal passband, and providing good frequency response.

Figure 1B:
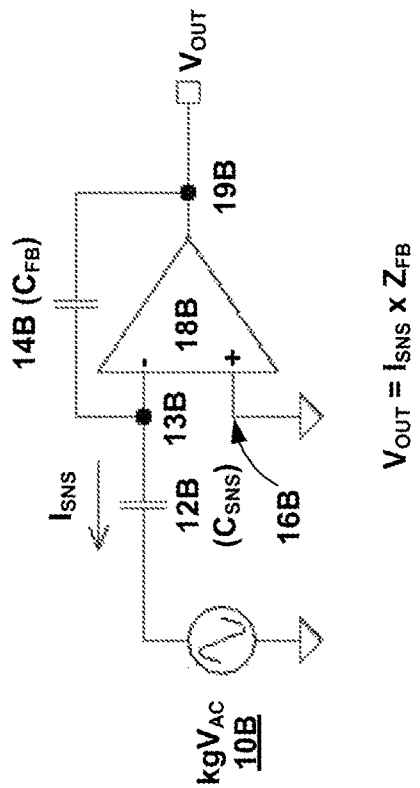
FIG. 1B is a schematic diagram illustrating an example of an alternating current (AC) TIA circuit.
Figure 1A:
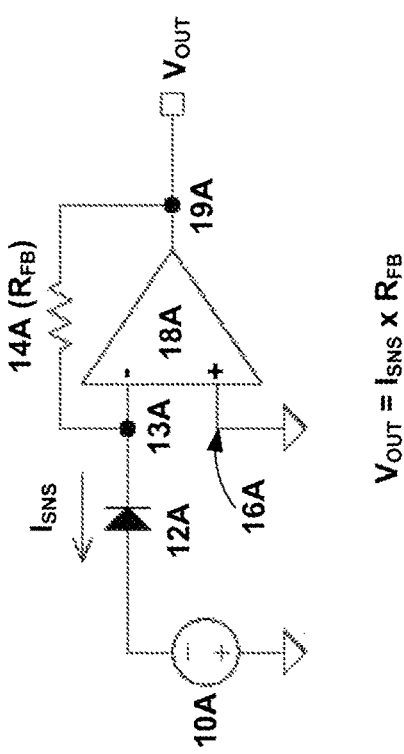
FIG. 1A is a schematic diagram illustrating an example of a direct current (DC) transimpedance amplifier (TIA) circuit.

FIG. 1A is a schematic diagram illustrating an example of a DC TIA circuit. The circuit of FIG. 1A may, for example, be used as a photodiode TIA interface. The TIA circuit of FIG. 1A includes voltage source 10A, diode 12A, feedback resistor 14A, and operational amplifier 18A (op amp 18A). Op amp 18A includes inverting input 13A, non-inverting input 16A, and output 19A. The anode end of diode 12A connects to voltage source 10A, and the cathode end of diode 12A connects to inverting input 13A. Feedback resistor 14A, which has a resistance value of $R_{FB}$, connects output 19A to inverting input 13A. The output voltage ($V_{OUT}$) at output 19A is proportional to the reverse diode current ($I_{SNS}$) of diode 12A which, in turn, is proportional to the incident light level at photodiode 12A. $V_{OUT}/I_{SNS}$ is equal to the value of the feedback impedance, $R_{FB}$, 14A around the amplifier. The terms "amplifier," operational amplifier, and op amp may be used interchangeably in this disclosure. A feature of this type of amplifier circuit is that the negative op amp input 13A is virtually grounded at a low impedance. This allows for large values of transimpedance gain ($R_{FB}$) without a reduction in signal bandwidth from the parasitic capacitance of the photodiode. The terms inverting input and negative input may be used interchangeably in this disclosure. Likewise, non-inverting input and positive input may also be used interchangeably.

The same basic principle described above with respect to FIG. 1A may apply to sensors that utilize an AC bias as shown in FIG. 1B. The circuit of FIG. 1B includes AC voltage source 10B, input capacitor 12B, op amp 18B, and feedback capacitor 14B. Op amp 18B includes inverting input 13B, non-inverting input 16B, and output 19B. Input capacitor 12B connects voltage source 10B to inverting input 13B of op amp 18B. Feedback capacitor 14B connects inverting input 13B to output 19B of op amp 18B. Non-inverting input 16B connects to ground. The circuit of FIG. 1B illustrates an example microelectromechanical system (MEMS) accelerometer interface using an op amp 18B with inverting 13B and non-inverting 16B inputs. In general, a MEMS accelerometer may be biased by a constant amplitude AC voltage source ($V_{AC}$) and the value of the sense capacitance ($C_{SNS}$), changes in response to the acceleration sensed. However, as shown in the example of FIG. 1B, a MEMS accelerometer may be modeled as an equivalent combination of a fixed capacitor 12B and a variable voltage source 10B. In this approximation, $C_{SNS}$ represents the value of the total MEMS capacitance at rest (i.e., at zero g), and the scale factor of the AC voltage source is constrained to be between plus and minus unity, $-1 < k*g < +1$ (10B). The value of k is measured in units of 1/g and the quantity $k*V_{AC}$ has units of V/g for constant values of $V_{AC}$. The value $|k*g|>1$ for very large values of acceleration may get very large, in theory. However, in practice because mechanical stops prevent excessive travel of the MEMS capacitor plates and values of k are always very small so that k*g may be much less than 10%. Accelerometer circuits may be biased at a fixed carrier frequency, $f_C$, so that the transfer characteristic of the amplifier, $V_{OUT}/I_{SNS}$, has a fixed value that is equal to the value of the feedback impedance around the amplifier.

$$Z_{FB} = 1/2\pi f_C C_{SNS} \quad (1)$$

However, $I_{SNS}$ is also a function of $C_{SNS}$ 12B and $V_{AC}$ 10B. Therefore, it may be possible to formulate the gain of an accelerometer TIA circuit in terms of sensed acceleration, g, and feedback capacitance $C_{FB}$ 14B as follows.

$$V_{OUT}/V_{AC} = kg(C_{SNS}/C_{FB}) \quad (2)$$

In practice, the circuit of FIG. 1B may rarely be used because finite non-zero input offset voltages and currents may force the output to one of the supply voltages.

Figure 2:
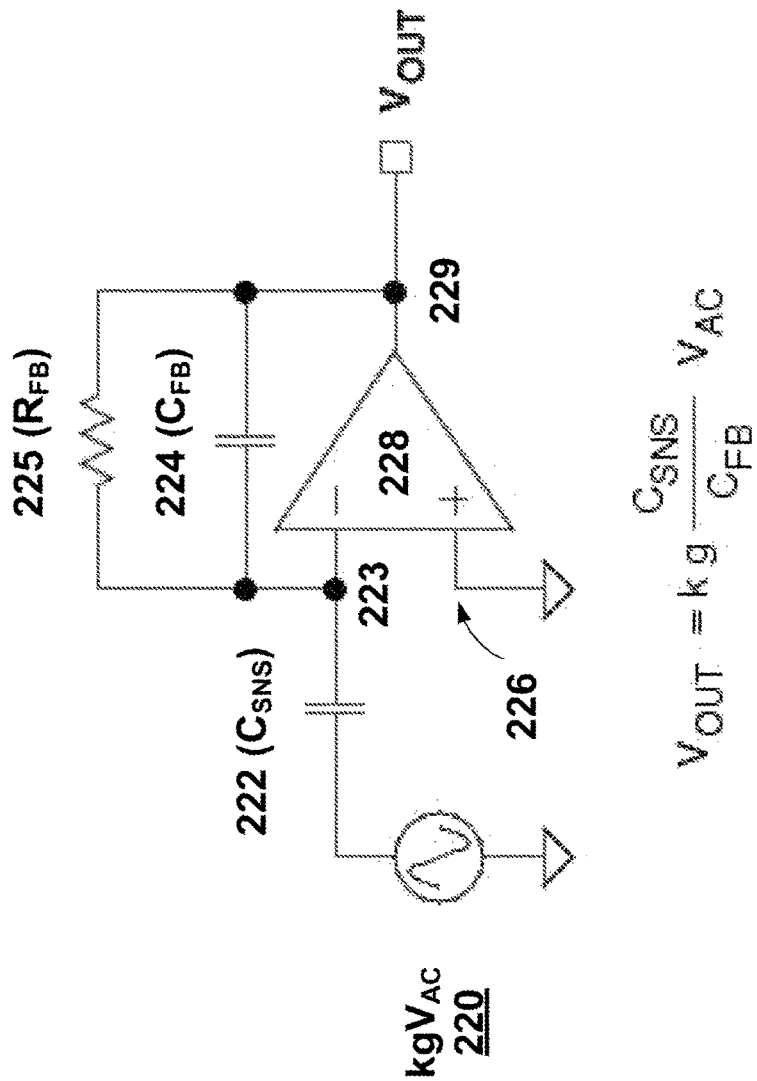
FIG. 2 is a schematic diagram illustrating an example of a TIA with a DC bias.

FIG. 2 shows an example of a TIA circuit with DC bias for use with capacitive sensors. The circuit of FIG. 2 includes variable AC voltage source 220, input capacitor 222, op amp 228 and feedback capacitor 224, with a value of $C_{FB}$ and feedback resistor 225, with a value of $R_{FB}$. Op amp 228 includes inverting input 223, non-inverting input 226, and output 229. Input capacitor 222 connects voltage source 220 to inverting input 223 of op amp 228. Feedback capacitor 224 connects inverting input 223 to output 229 of op amp 228. Feedback resistor 225 connects inverting input 223 to output 229, in parallel with feedback capacitor 224. Non-inverting input 226 connects to ground.

The TIA circuit of FIG. 2 may be a practical TIA circuit for accelerometer and gyroscope MEMS applications. This circuit includes resistor 225 to provide a DC bias point for operation of op amp 228. To minimize losses and noise injection, the value of this resistor may be very large: $R_{FB} \gg DR*Z_{FB}(f_C)$, where DR is the dynamic range of the system or the ratio of the maximum output signal level to the noise floor. These circuits may use small values of $C_{SNS}$ and $C_{FB}$ (e.g. pico-farads), and values of $R_{FB}$ on the order of one giga-ohm or more. Op amp 228 may have an input resistance much greater than $R_{FB}$ to minimize amplifier noise gain. Thus, even though the negative input pin 223 of op amp 228 is at a virtual ground (may be less than 100 ohms), the input resistance of op amp 228 may be much greater than a giga-ohm. Op amp 228 may also have low input capacitance and low noise.

These constraints may make the design of transimpedance amplifiers for capacitive sensor circuits very difficult. A potential roadblock in implementing the circuit of FIG. 2 in an IC is the implementation of the feedback resistor itself. A semiconductor process that allows for the construction of a giga-ohm resistor may take up a large area of the IC and may have one pico-farad of parasitic capacitance or more. By way of example, consider the construction of a poly-silicon resistor having a very high resistivity (by industry standards) of 10 kilo-ohms/square, a minimum width of 1 um, and a minimum pitch between resistor segments of 1 um. A 1 giga-ohm resistor made with this process may require an area of 500×400 um and could have a parasitic capacitance of about 100 pF. In other words, it may be at least twice the size of a low-noise op amp on an IC and may have too much parasitic capacitance to allow capacitor 224 to control the AC gain of the circuit.

Figure 3A:
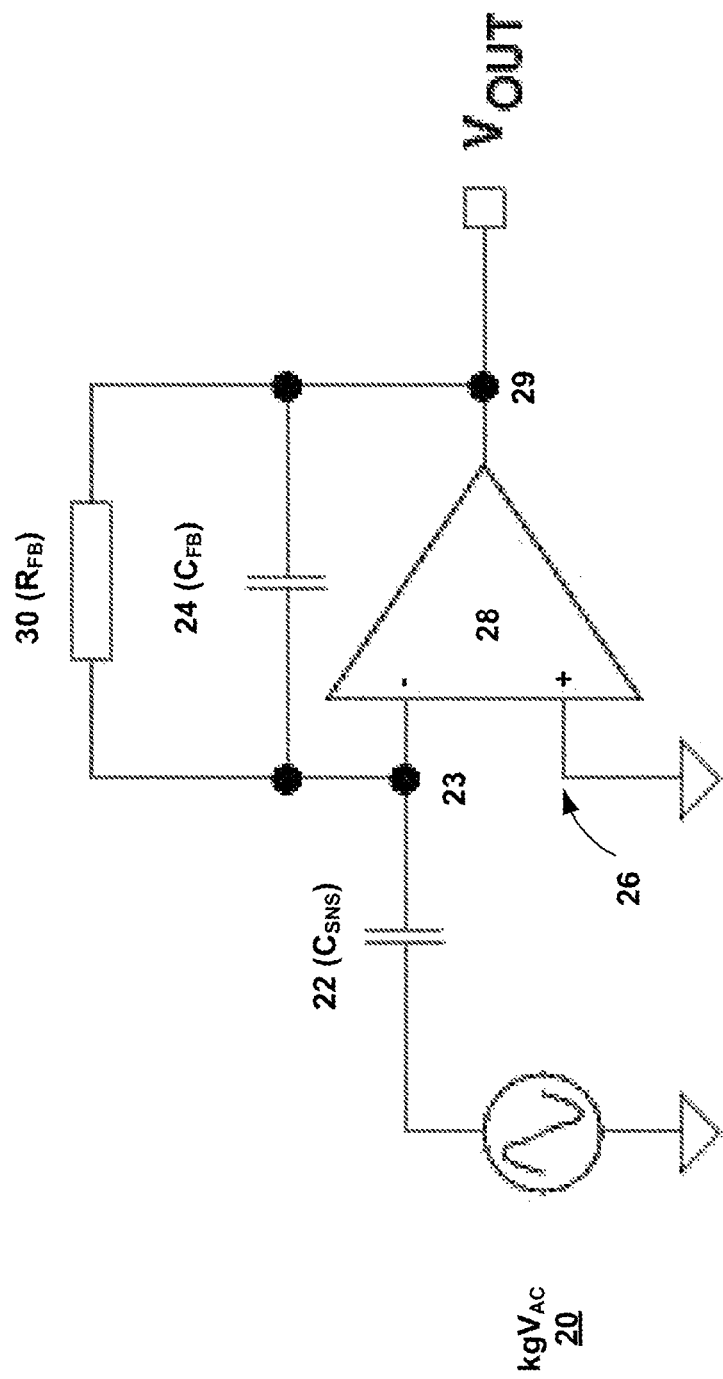
FIG. 3A is a schematic diagram illustrating an example of a TIA circuit using a pseudo-resistor for DC feedback.

FIG. 3A is a schematic diagram illustrating an example of a TIA circuit using a pseudo-resistor for DC feedback. FIG. 3A operates substantially similar to the circuit of FIG. 2. FIG. 3A depicts a TIA circuit with op amp 28, inputs 23 and 26, a feedback circuit including resistor 30 (with resistance value $R_{FB}$) and capacitor 24 (with capacitance value $C_{FB}$) with a sensor equivalent circuit input 20 (with an input signal equal to $kgV_{AC}$) and capacitor 22 (with capacitance value $C_{SNS}$). Input capacitor 22 connects voltage source 20 to inverting input 23 of op amp 28. Feedback capacitor 24 connects inverting input 23 to output 29 of op amp 28. Feedback resistor 30 connects inverting input 23 to output 29, in parallel with feedback capacitor 24. Non-inverting input 26 connects to ground.

One technique for reducing the area on an IC used to implement a feedback resistor is to implement the feedback resistor using a metal-oxide-semiconductor field-effect transistor (MOSFET) based pseudo-resistor circuit. Thus, in the example of FIG. 3A, $R_{FB}$ 30 may be a MOSFET-based pseudo-resistor. There are several ways to implement pseudo-resistors but two possible circuits are shown by way of example in FIGS. 3B and 3C.

Figure 3C:
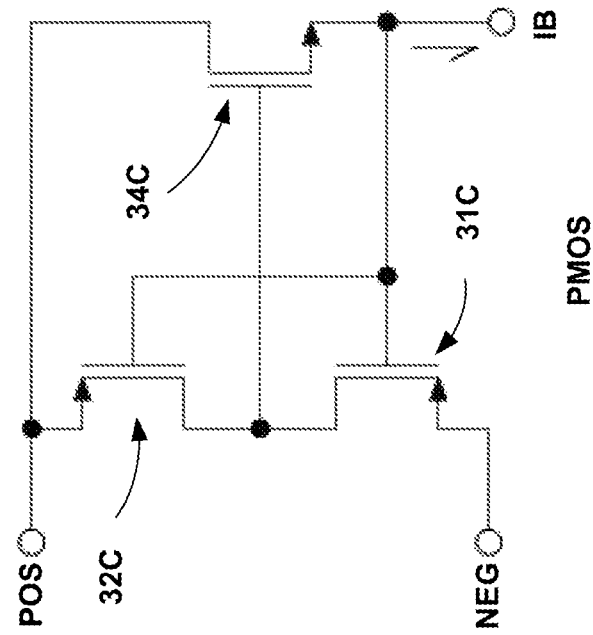
FIG. 3C is a schematic diagram illustrating an example PMOS version of a pseudo-resistor.
Figure 3B:
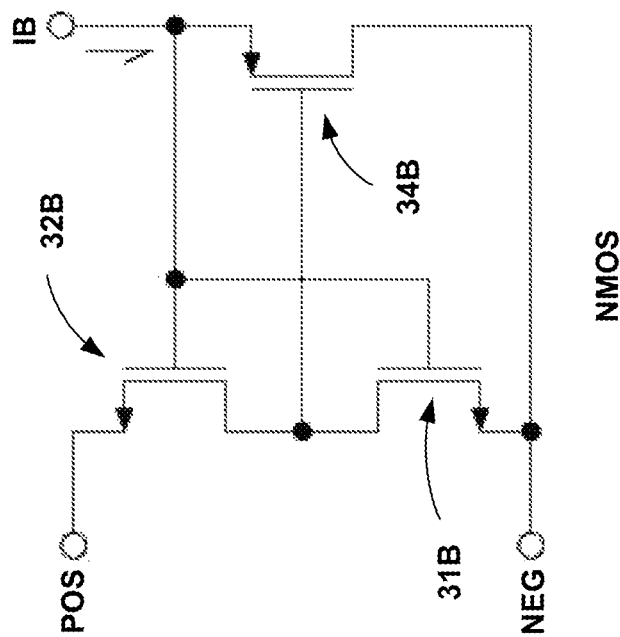
FIG. 3B is a schematic diagram illustrating an example MOSFET-based pseudo-resistor configured as NMOS.

FIG. 3B illustrates an example of a negative metal-oxide-semiconductor (NMOS) implementation including two n-channel MOSFETs 31B, 32B and one p-channel MOSFET 34B. MOSFETS 31B and 32B connect in series with the drains of each connected together as well as connected to the gate of MOSFET 34B. The gates of both 31B and 32B connect to each other and to the source of MOSFET 34B. The drain of 34B connects to the source of 31B as well as to the negative terminal of the pseudo-resistor circuit. The source of 32B is the positive terminal, while the source of 34B is an "IB" terminal, in this example.

FIG. 3C illustrates a similar positive metal-oxide-semiconductor (PMOS) EXAMPLE implementation including two p-channel MOSFETs 31C, 32C and one n-channel MOSFET 34C. MOSFETS 31C and 32C connect in series with the drains of each connected together as well as connected to the gate of MOSFET 34C. The gates of both 31C and 32C connect to each other and to the source of MOSFET 34C. The drain of 34C connects to the source of 31C as well as to the positive terminal of the pseudo-resistor circuit. The source of 31C is the negative terminal, while the source of 34C is an "IB" terminal, in this example.

A pseudo-resistor circuit operates in the MOSFET sub-threshold region and utilizes a very small DC bias current (of around 10 nA). However, they may be physically very small (on the order of 20 um×30 um), may have very low parasitic capacitance (less than 0.1 pF), and be able to provide an approximately linear resistance over a narrow range of voltages (e.g. ±100 mV).

Figure 4:
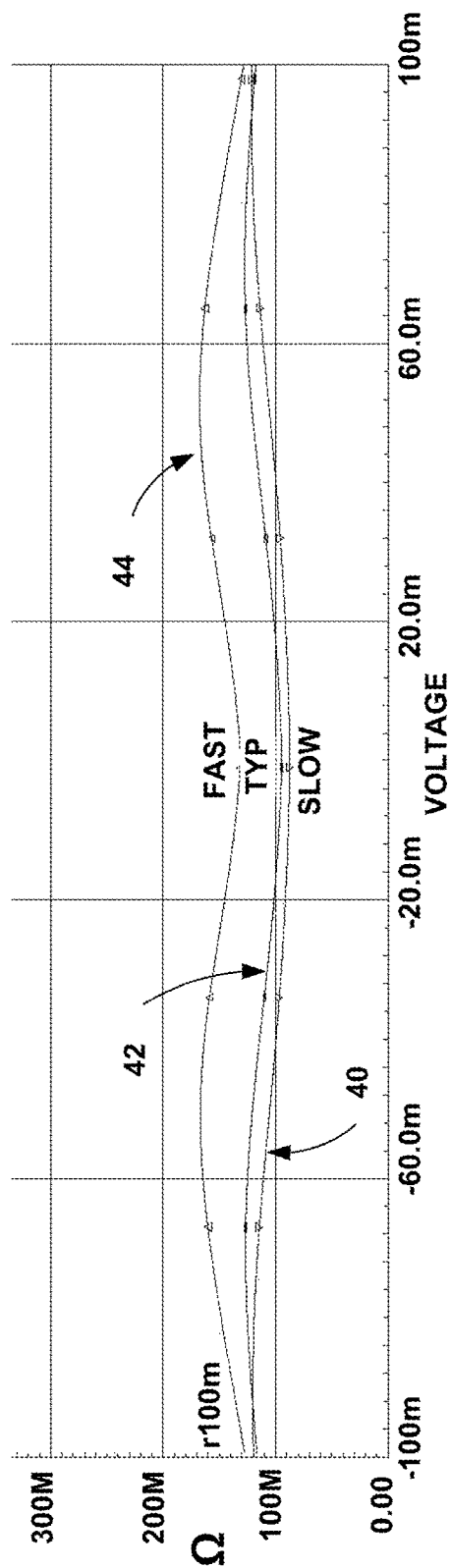
FIG. 4 is a graph illustrating the resistance of a pseudo-resistor as a function of the terminal voltages of the pseudo-resistor.

FIG. 4 is a graph illustrating the resistance of a pseudo-resistor as a function of the terminal voltages of the pseudo-resistor. FIG. 4 plots the resistance across the two active pseudo-resistor terminals (POS and NEG) in FIGS. 3B and 3C as a function of the voltage across these terminals as an example implementation. Plot 44 depicts a fast process corner, while plots 42 and 40 depict typical and slow process corners, respectively. Statistical process corners may also be called process limits. Pseudo-resistors may be used in TIA circuits as replacements for large poly-silicon resistors. However, they may still have potential disadvantages. As one example, pseudo resistors may limit the range of the TIA output voltage. This means that a second amplifier may be needed to provide additional gain, negating part of their advantage in taking up a small area. Second, even within their intended voltage range of operation, pseudo resistor non-linearity, most visible for the fast process corner 44, may cause amplifier distortion of −40 dB to −60 dB, even though their nominal resistance is much greater than the impedance of the feedback capacitor at the frequency of operation. Furthermore, this distortion varies with process, temperature, and the pseudo-resistor bias current. In very high precision systems, like MEMS accelerometers, this may make it very difficult to compensate for this distortion in software.

Figure 5:
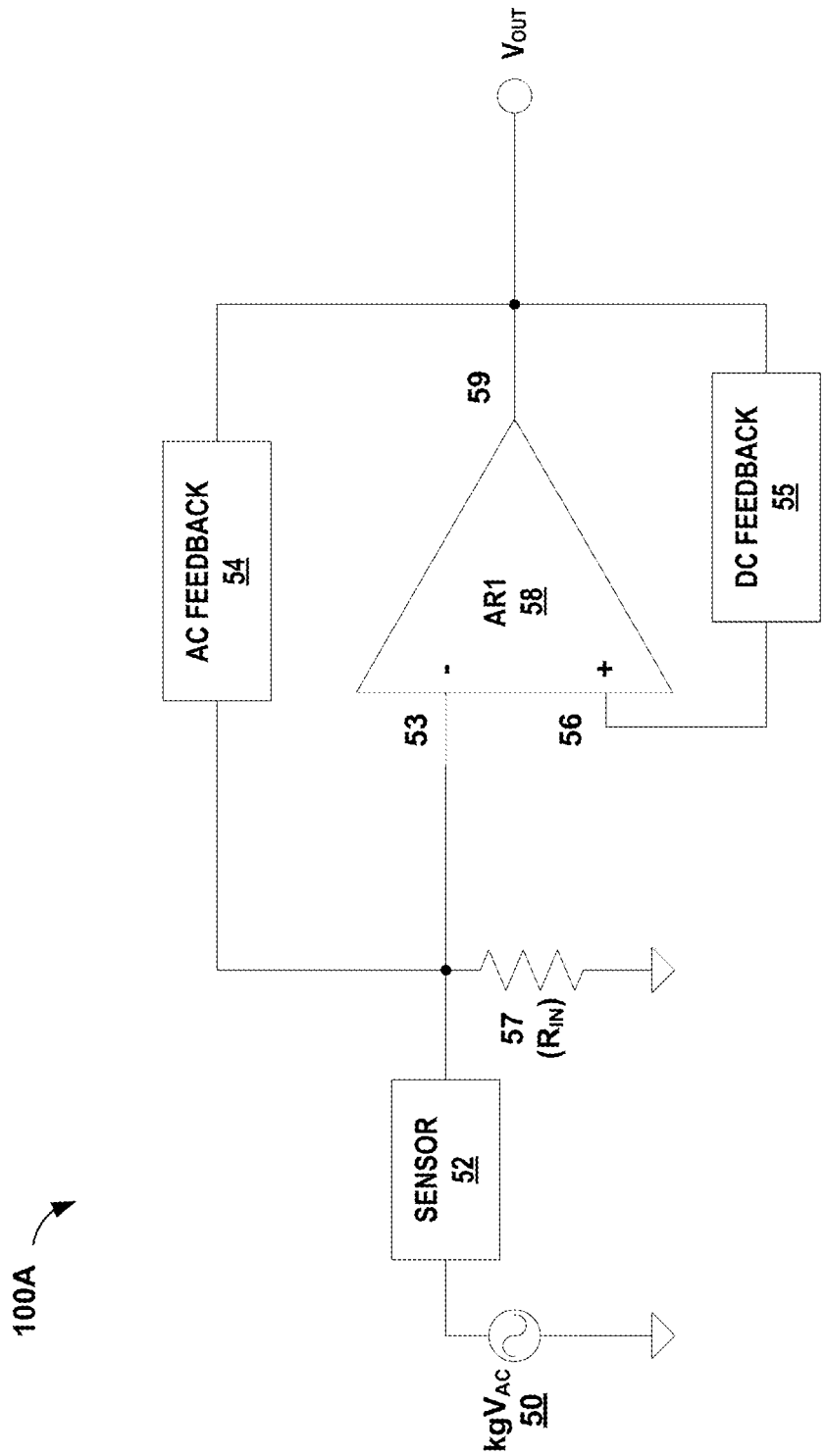
FIG. 5 is a block diagram illustrating an example TIA circuit with an AC signal path separate from a DC bias path, in accordance with one or more techniques of this disclosure.

FIG. 5 is a conceptual and schematic block diagram illustrating a transimpedance amplifier circuit with an AC signal path separate from a DC bias path, in accordance with one or more techniques of this disclosure. In other words, the AC signal path and DC bias path functions are implemented by using components connected to two separate sets of circuit nodes. TIA circuit 100A may include AC sensor bias circuit 50 (kgV$_{AC}$), a sensor 52, high impedance input resistor 57 (with a resistance value R$_{IN}$), op amp 58, an AC signal path 54, and a separate DC bias feedback path 55. Op amp 58 may include inverting input port 53, non-inverting input port 56, and output 59. AC signal path 54 may connect the op amp output 59 and the negative input port 53 and may include input resistor 57, which may connect inverting input port 53 to ground. Separate DC bias feedback path 55 may connect output 59 to positive input port 56.

Transimpedance amplifier circuit 100A may be used with a wide variety of AC sensors. Sensor 52 may, for example, be any of a MEMS accelerometer, MEMS gyroscope, humidity sensor or other type of capacitive sensor. The AC sensor bias 50 may connect to a sensor input to drive sensor 52 as described above, and an output of sensor 52 may connect to both input resistor 57 and amplifier input 53. In the example of FIG. 5, the output for sensor 52 connects to the negative input pin 53. Resistor 57 may be a high resistance pseudo-resistor that connects the negative TIA input pin 53 and input side of AC feedback signal path 54 to system ground. In this circuit, the non-linear resistance of the pseudo-resistor may not be a concern during operation because the voltage across resistor 57 is constant (e.g. zero). DC bias path 55 may be configured to ensure that output 59 operates away from one of the power supply voltages (not shown), as described above. Another name for the power supply voltage may be power supply rail. The bandwidth of the DC bias path 55 may be significantly less than the operating frequency of circuit 100A through AC signal path 54, described in more detail below.

One example technique to model a capacitive sensor, such as a MEMS accelerometer, is to use an AC sensor bias circuit with a fixed capacitance. FIG. 5 may depict an example model of a capacitive sensor by assuming sensor 52 is a fixed capacitance connected to a variable AC sensor bias 50. This is further described and depicted in FIGS. 6-11 below.

Figure 6A:
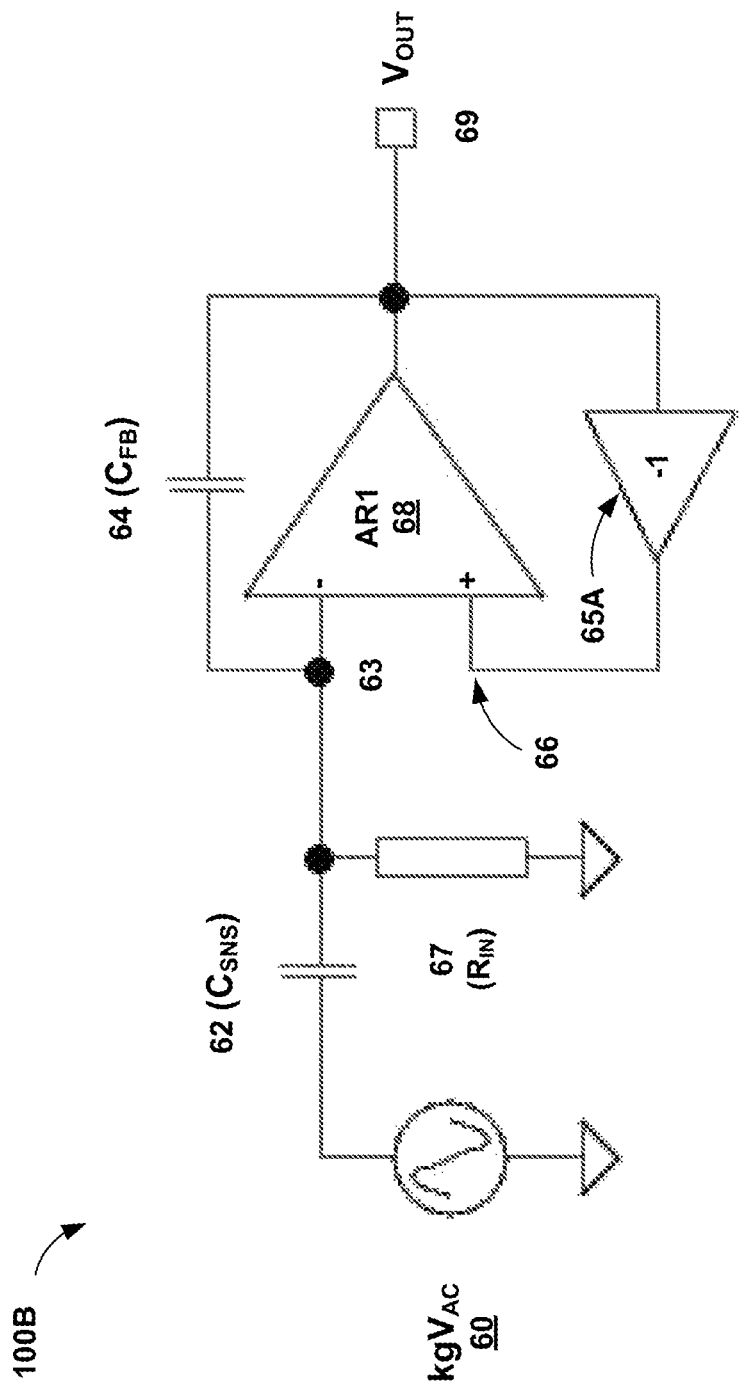
FIG. 6A is a schematic diagram illustrating an example TIA circuit with an AC feedback signal path separate from a DC bias feedback path.

FIG. 6A is a schematic diagram illustrating an example TIA circuit with an AC feedback signal path separate from a DC bias feedback path. TIA circuit 100B may include AC sensor bias circuit 60 (kgV$_{AC}$), input capacitor 62 (with a capacitance of C$_{SNS}$), a high impedance input resistor 67 (with a resistance of R$_{IN}$), op amp 68, feedback capacitor 64 (with a capacitance value of C$_{FB}$) and an inverting feedback amplifier 65A. Op amp 68 may include inverting input pin 63, non-inverting input pin 66 and output 69. The AC signal path may include feedback capacitor 64 (with capacitance value C$_{FB}$) connected between the op amp output 69 and the negative input pin 63, as well as input resistor 67, which connects inverting input 63 to ground. A separate DC bias feedback path may include inverting feedback amplifier 65A connected between output 69 and the non-inverting input pin 66. Variable AC sensor bias circuit 60 (kgV$_{AC}$), fixed input capacitor 62 (with a capacitance of C$_{SNS}$) may model any capacitive sensor, such as a MEMS accelerometer.

TIA circuit 100B illustrates another example technique for supplying DC bias. In the example of TIA circuit 100B, inverting feedback amplifier 65A may couple TIA output 69 to non-inverting input pin 66 to provide overall negative feedback. The sensor, as modeled by AC sensor bias circuit 60 and capacitor 62, couples to the TIA input, 63. Then, the negative TIA input 63 is grounded through a very high resistance pseudo-resistor 67. In this circuit, the non-linear resistance of pseudo-resistor 67 may not be a concern during operation because the voltage across resistor 67 is constant (e.g. zero). In addition, when power is first applied to this circuit, the resistor non-linearity of resistor 67 may help to speed up the charging of capacitor 64 to the required DC voltage. The inverting feedback amplifier 65A adjusts for the TIA input offsets and having only capacitor 64 in the AC feedback path may provide a highly linear gain (with low distortion).

As noted above, the bandwidth of inverting feedback amplifier 65A in the DC bias path may be much less than the bandwidth of op amp 68 so that $V_{OUT}$ does not go to zero at high frequencies. For example, let $f_1$ be the maximum operating frequency of op amp 68 and let $f_2$ be the maximum operating frequency of op amp 65A. In general, $f_1 \gg f_2$, and the circuit of FIG. 6A passes frequencies between $f_2$ (low) and $f_1$ (high). While it is possible to design an inverting amplifier with any desired maximum operating frequency, combining an op amp with one or more passive low-pass filters (LPFs) to implement this function may give greater precision and robustness. The filtering function may be implemented by at least one low-pass filter stage. For example, the filtering function may be implemented by (a) placing a LPF between output 69 and inverting feedback amplifier 65A input, (b) by placing a LPF between inverting feedback amplifier 65A output and non-inverting input pin 66 input, or (c) by adding a feedback capacitor in parallel with a resistor between non-inverting input pin 66 and output 69. Any combination of these techniques (and many others) may be used.

Figure 6B:
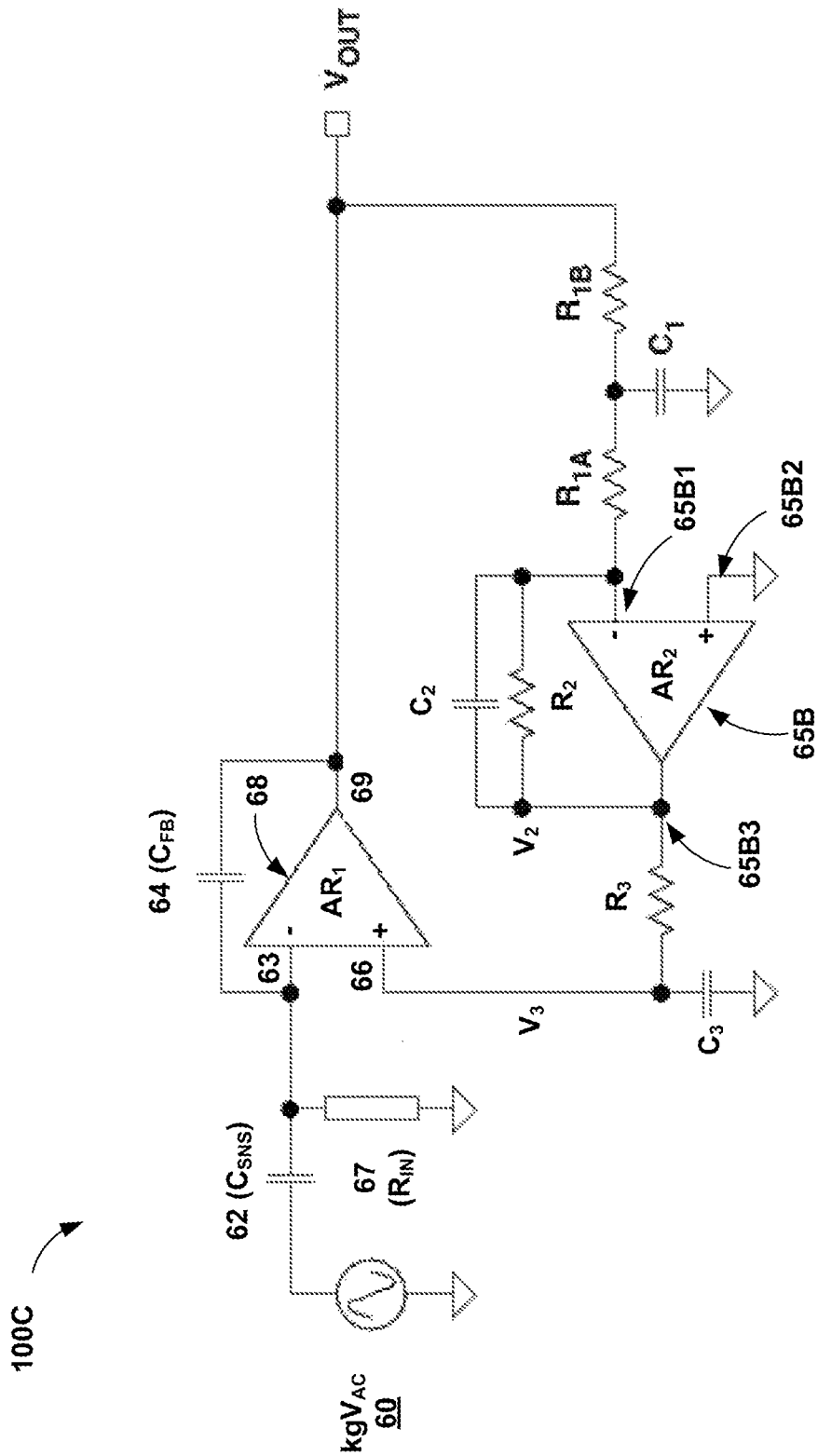
FIG. 6B is a schematic diagram illustrating a more detailed view of an example DC bias feedback path using low-pass filters (LPF) for DC bias.

FIG. 6B is a schematic diagram illustrating a more detailed view of an example DC bias feedback path using LPFs for DC bias. TIA circuit 100C is generally the same circuit as FIG. 6A with an example DC bias path showing additional details. TIA circuit 100C may include AC sensor bias circuit 60 ($kgV_{AC}$), input capacitor 62, a high impedance input resistor 67 (with resistance $R_{IN}$), op amp 68, feedback capacitor 64, and an inverting feedback amplifier 65A, as shown above in FIG. 6A. Op amp 68 may include inverting input pin 63, non-inverting input pin 66 and output 69. The AC signal path may include feedback capacitor 64 (with capacitance $C_{FB}$) connected between the op amp output 69 and the negative input pin 63, as well as resistor 67, which connects input 63 to ground. The separate DC bias feedback path may include inverting op amp circuit of 65A from FIG. 6A, connected between output 69 and the positive input port 66, but showing additional details and low-pass filters.

The DC bias path of circuit 100C may include op amp 65B, with an input LPF (example (a) from above), an output LPF (example (b) from above) and a feedback capacitor in parallel with R2 (example (c) from above). Op amp 65B may include output 65B3, inverting input 65B1 and non-inverting input 65B2. The input LPF may include $R_{1A}$, $R_{1B}$ and $C_1$ and the output LPF may include $R_3$ and $C_3$. The feedback for inverting amplifier 65B may include $C_2$ and $R_2$. $R_{1A}$ and $R_{1B}$ in series connect the output of AR1, 69 to inverting input 65B1. $C_1$ connects the node between $R_{1A}$ and $R_{1B}$ to ground. Feedback components $C_2$ and $R_2$ connect inverting input 65B1 to output 65B3 of op amp 65B. $R_3$ connects output 65B3 to non-inverting input 66, while $C_3$ connects non-inverting input 66 to ground. The non-inverting input 65B2 for op amp 65B connects directly to ground in this example. This description of the DC bias path shown in FIG. 6B is just one of many ways to implement the DC bias path.

The circuit of FIG. 6B shows, by way of example, all three LPF example techniques mentioned above used together. One potential advantage of using the feedback amplifier circuit of FIG. 6B for TIA amplifier DC restoration may be that the passive resistors and capacitors may have more feasible values ($R \ll 10^9$ and $C > 0.1$ pF) that may be implemented in an IC with less area. DC restore circuits may shift the average DC value of the output signal in a positive or negative direction by a desired DC bias amount by connecting the positive input of AR2 to a DC voltage other than zero (ground).

Similar to state-variable filters, the values for R and C may be adjusted for reduced area by changing the gain around AR2 (65B), $A_{V2} = -R2/R1$. In other words, by reducing the magnitude of the gain ($|A_{V2}|$) lower values of resistance and capacitance may be used for fixed value of $f_2$. However, before doing so, one should be aware of three effects.

First, this type of TIA circuit may avoid the formation of a low frequency peak near $f_2$ by ensuring the value of the low frequency cut-off, $f_2$, is greater than the value of the input resonance, $f_0$, (defined below):

$$f_0 = 1/2\pi R_{IN}(C_{SNS} + C_{FB}) < f_2 < f_1 \quad (3)$$

Second, decreasing the gain around AR2 may also increase the output offset voltage. The TIA output offset voltage, $V_{OS}(OUT)$, is related to the closed-loop gain of op amp 65B, $A_{V2}$, per the equation below where $V_{OS1}$ is the offset voltage of AR1 (68), $V_{OS2}$ is the offset voltage of AR2 (65B), R2 is the feedback resistance around op amp 65B, and R1 is the sum of R1A and R1B as shown in FIG. 6B.

$$V_{OS(OUT)} = (R_1/R_2)V_{OS1} + (1 + R_1/R_2)V_{OS2} \quad (4)$$

Substituting $A_{V2}$ for R1 and R2, this becomes $$V_{OS(OUT)} = (1/|A_{V2}|)V_{OS1} + (1 + 1/|A_{V2}|)V_{OS2}. \quad (5)$$

Note that, $V_{OS(OUT)}$ is a minimum when $|A_{V2}|$ is much greater than unity. $V_{OS}(OUT)$ reduces to $(V_{OS1} + 2V_{OS2})$ when $A_{V2} = -1$; and becomes very large when $|A_{V2}|$ is much less than unity.

Third, the TIA output noise, $V_N(OUT)$, is also related to $A_{V2}$, in essentially the same way. Let $V_{N1}$ represent the input referred noise voltage of AR1 (68) and let $V_{N2}$ represent the input referred noise voltage of op amp 65B. Then the output noise may be described as $$V_{N(OUT)} = (1/|A_{V2}|)V_{N1} + (1 + 1/|A_{V2}|)V_{N2}. \quad (6)$$

Note that the output noise due to this DC biasing scheme may become very large for small values of $A_{V2}$ (when $|A_{V2}| \ll 1$). Equation (6) describes the noise behavior of this circuit at low frequencies below $f_2$. However, the equation can also describe the noise behavior of this circuit above $f_2$ if the R3-C3 low-pass filter is left out of the circuit. The R3-C3 filter may have greater impact than the other LP filters and may be advantageous if included in low noise systems. With the passive R3-C3 low-pass filter in place, the output noise in the signal passband between $f_2$ and $f_1$ may be dominated by the gain of the AR1 (68) stage.

$$V_{N(OUT)} = (1 + C_{SNS}/C_{FB})V_{N1m} \quad (7)$$

Because of these three effects, the designer should consider the tradeoff of the area consumed by the low-pass filter versus the amount of output noise and the magnitude of the output offset voltage when adjusting the value of $A_{V2}$ (i.e., R2/R1). Never-the-less, the TIA architecture shown in FIGS. 6A and 6B may provide the advantage of a full range output voltage and improved linearity without increasing costs in area and power consumption when compared to other circuits.

Figure 7:
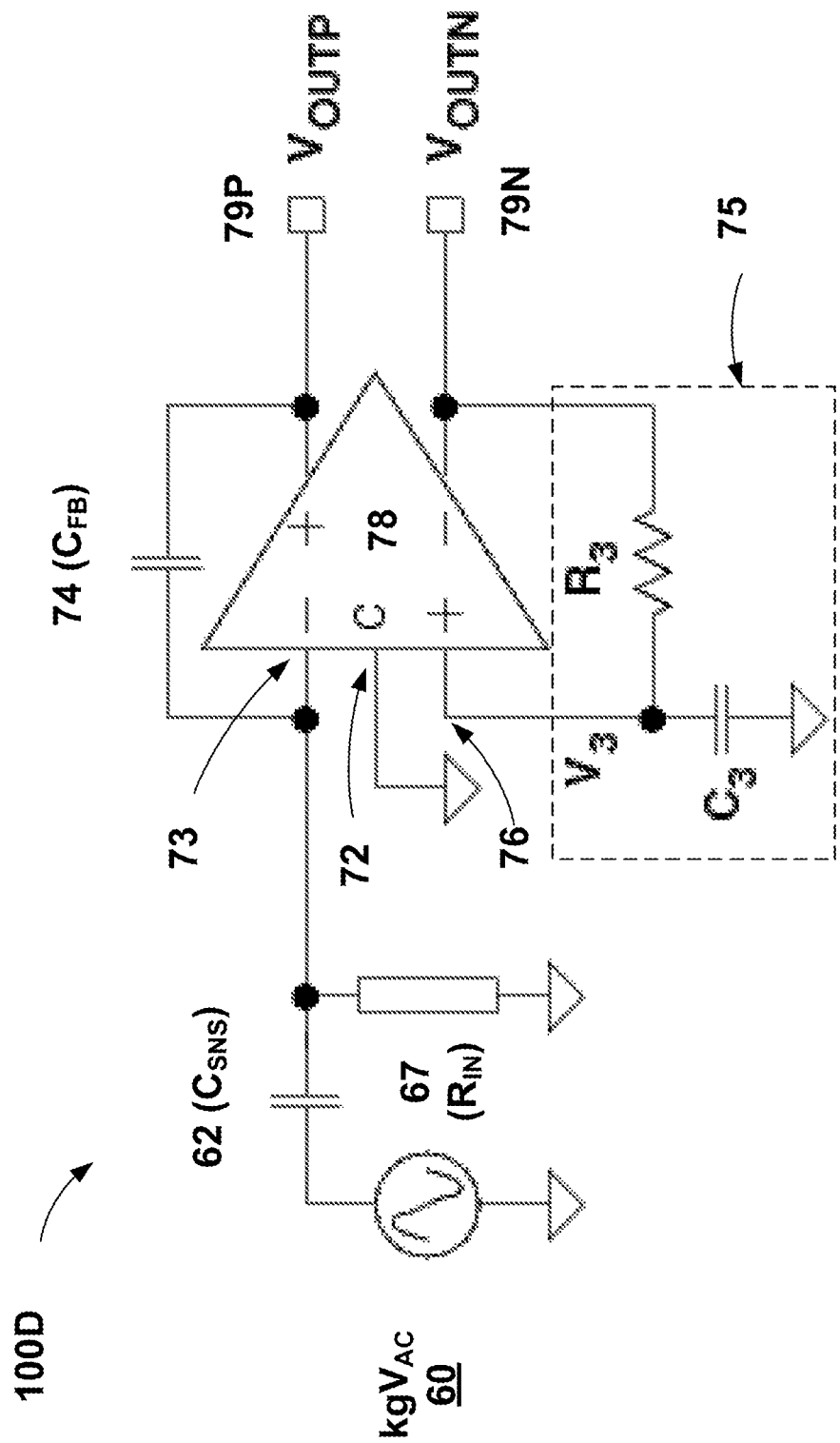
FIG. 7 is a schematic diagram illustrating an example TIA circuit with differential output, a common mode reference voltage input, an AC signal path and separate direct feedback for the DC bias path.

FIG. 7 is a schematic diagram illustrating an example TIA circuit 100D with differential output, a common mode reference voltage input, an AC signal path and separate direct feedback for the DC bias path. TIA circuit 100D may include AC sensor bias circuit 60 ($kgV_{AC}$), input capacitor 62, a high impedance input resistor $R_{IN}$ (67), differential amplifier 78, feedback capacitor 74 and separate DC bias feedback path 75. Differential amp 78 may include inverting input pin 73, non-inverting input pin 76, positive output 79P and negative output 79N and common mode reference voltage input 72. The AC signal path may include feedback capacitor 74, with value $C_{FB}$, connected between the differential amp positive output 79P and the negative input pin 73, as well as $R_{IN}$ (67), which connects input 73 to ground. The capacitive sensor model (e.g. $C_{SNS}$ 62 and AC sensor bias 60) is analogous to the capacitive sensor model shown in FIG. 6A. The separate DC bias feedback path 75 may include R3 and C3. R3 connects negative output 79N to non-inverting input 76, while C3 connects non-inverting input 76 to ground. In the example of circuit 100D common mode reference voltage input 72 connects directly to ground. Common mode reference voltage input 72 may be configured as an input to set the common mode output voltage.

In some example sensor interface circuits, it may be desirable for the TIA to have a differential output, depicted by positive output pin 79P and by negative output pin 79N. A differential amplifier 78 used in place of an op amp may avoid the need for a second inverting amplifier. The example FIG. 7 depicts one example technique for DC biasing. Here, inverting output $V_{OUTN}$ (79N) feeds back to the non-inverting input $V_3$ (76) through the DC bias path, which includes a low-pass filter (R3/C3) 75. For purposes of calculating output noise, offset, and the value of f2, this circuit may be functionally equivalent to the circuit of FIG. 6B when $A_{V2}=-1$. As above, the example of FIG. 7 depicts an AC signal path through $C_{FB}$ 74. The "C" input pin may be used to set the common mode output voltage of the $V_{OUTP}$ 79P and $V_{OUTN}$ 79N pins, and may be tied to ground, as shown in circuit 100D.

Figure 8:
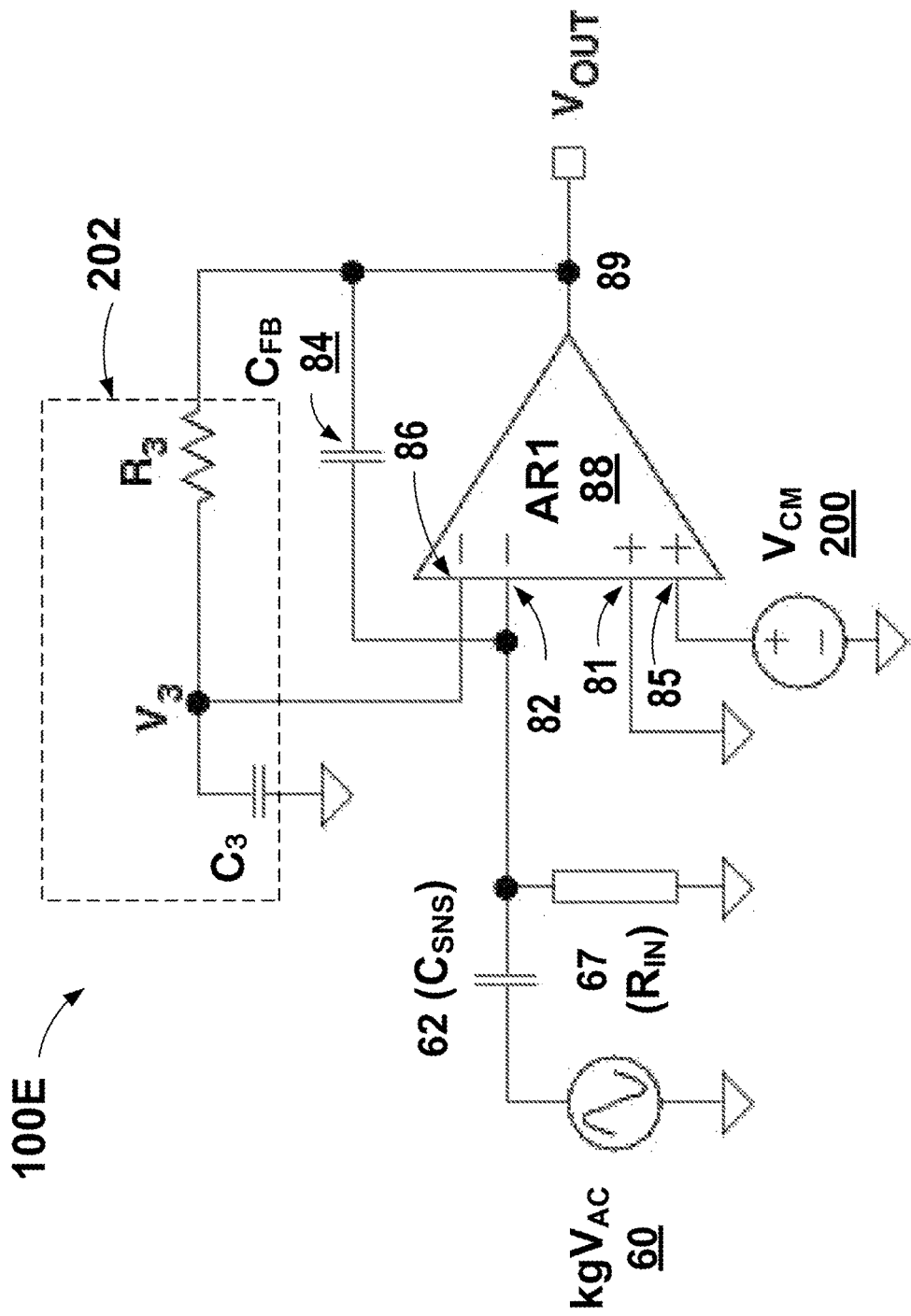
FIG. 8 is a schematic diagram illustrating an example TIA circuit with two differential input ports and a single output port and separate DC bias feedback and AC signal paths.
Figure 10:
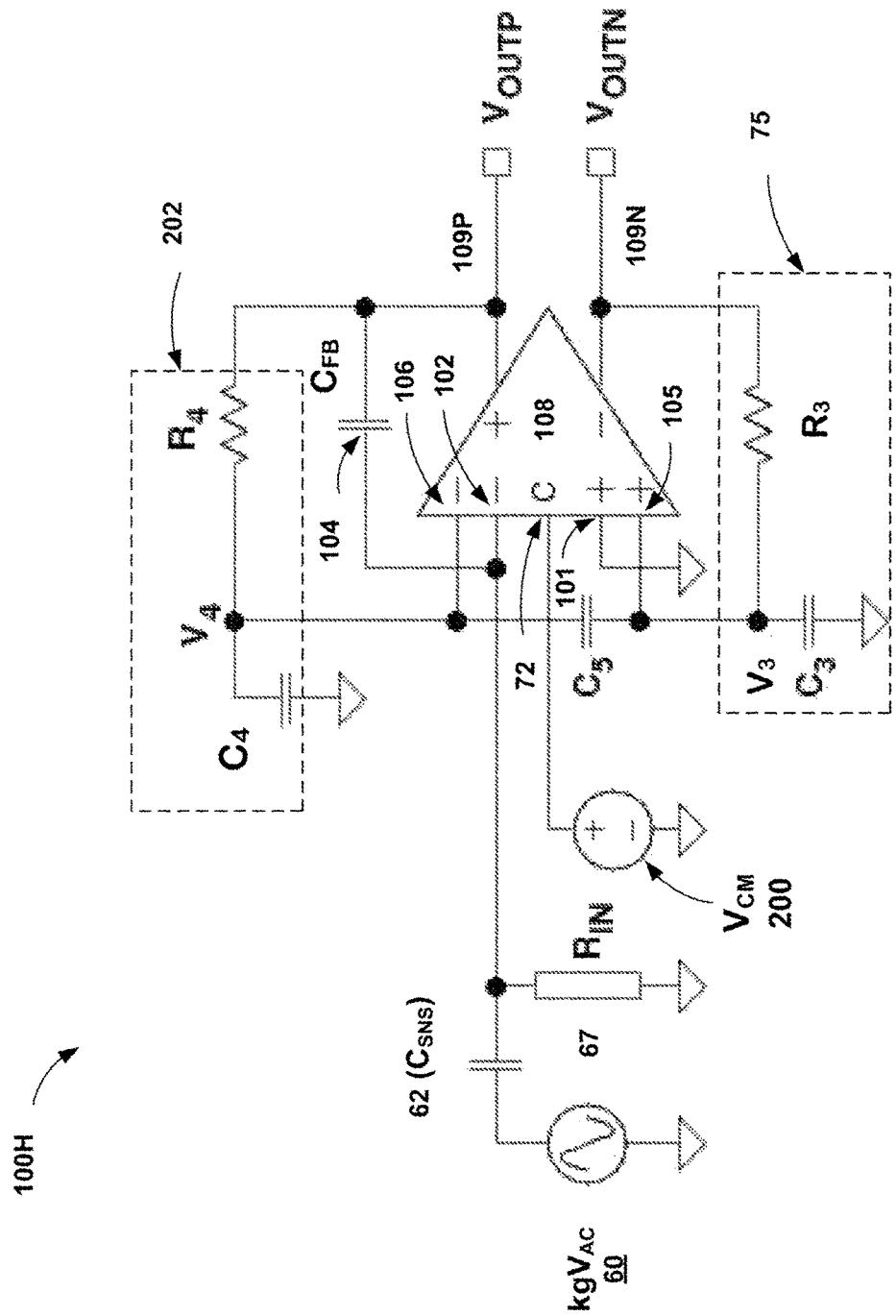
FIG. 10 is a schematic diagram illustrating an example TIA circuit with two differential input ports, a differential output, and a differential low-pass filter.
Figure 11:
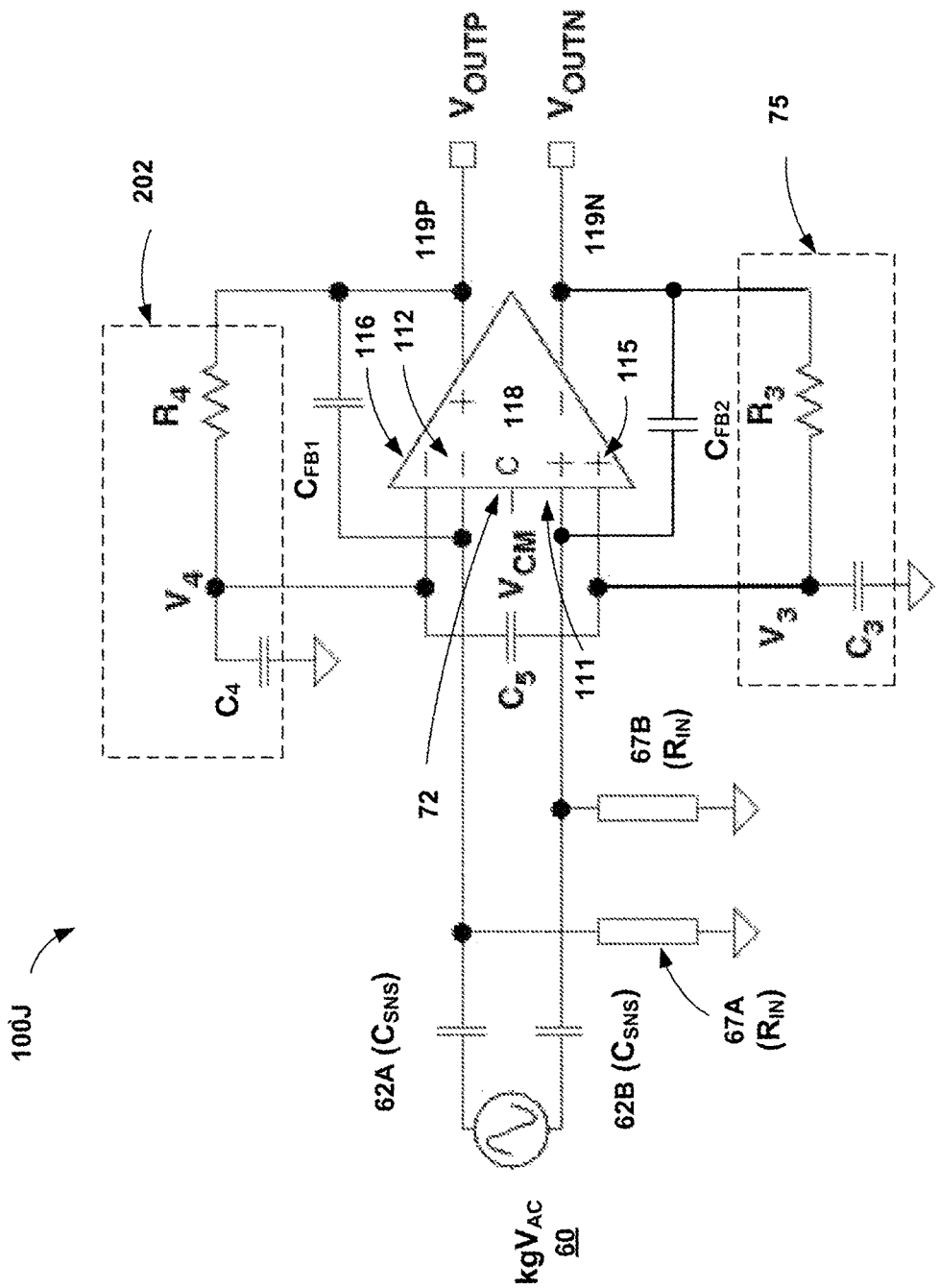
FIG. 11 is a schematic diagram illustrating an example TIA circuit connected to a differential sensor with two differential input ports, a differential output, and a differential low-pass filter.

Dual port op amps having two pairs of input transistors (two differential input ports) may be used in auto-zeroing amplifiers and other applications. FIGS. 8-11 depict circuits that may also be used in TIA applications to eliminate the need for a second inverting amplifier to provide a DC operating point as described above. FIG. 8 shows an example of an amplifier with a single output while FIGS. 9-11 depict three possible examples using an amplifier with a pair of differential outputs.

FIG. 8 is a schematic diagram illustrating an example TIA circuit using and amplifier with two differential input ports, a single output pin and separate DC bias feedback and AC signal paths. TIA circuit 100E may include AC sensor bias circuit 60 ($kgV_{AC}$), input capacitor 62, a high impedance input resistor $R_{IN}$ (67), amplifier AR1 (88), feedback capacitor 84, LPF 202 in the DC bias path, and common mode voltage source 200. Amplifier 88 may include an inner (primary) pair of differential input pins 81-82, an outer (secondary) set of differential input pins 85-86 and output 89. The primary input pins include inverting input pin 82 and non-inverting input pin 81, while the secondary input pins include inverting input pin 86 and non-inverting input pin 85. The AC signal path may include feedback capacitor 84, with value $C_{FB}$, connected between the op amp output 89 and the inner negative input pin 82, as well as $R_{IN}$ (67), which connects input 82 to ground. The separate DC bias feedback path may include LPF 202, which includes $R_3$ and $C_3$. $R_3$ connects output 89 to secondary inverting input 86, while $C_3$ connects inverting input 86 to ground. In the example of circuit 100E common mode voltage source 200, connects secondary non-inverting input pin 85 to ground.

In the example of FIG. 8, the inner (primary) pair of input pins 81 and 82 may be connected with the positive input 81 grounded and the negative input 82 connected to $C_{FB}$ 84, $C_{SNS}$ 62, and $R_{IN}$ 67. Primary negative input pin 82 is part of the AC signal path, which in this example also may include a capacitive sensor model (e.g. $C_{SNS}$ 62 and AC sensor bias 60). The capacitive sensor model is analogous to the capacitive sensor model shown in FIG. 6A. As above, the capacitive sensor may be an accelerometer or other type of sensor. The outer (secondary) pair of input pins 86 and 85 first connects the positive input 85 to a common mode reference voltage, $V_{CM}$ (200). Secondary negative input 86 connects to $V_{OUT}$ through low-pass filter 202, the DC bias path, which includes $C_3$ and $R_3$. In systems with dual supply voltages (e.g., ±15V), the value of $V_{CM}$ may be zero. However, in single supply systems $V_{CM}$ may have a non-zero value (e.g., half of the supply voltage). This circuit may offer advantages in single supply systems as the primary and secondary input ports may operate at different DC voltages.

FIG. 8 illustrates the separation of the AC signal path 54 from the DC bias path 55, as described in FIG. 5. The AC gain function is accomplished by the primary negative input pin 82. The primary input port in the example of FIG. 8 consists of input pins 81-82 and the secondary input port consists of pins 85-86. Primary port's negative input pin 82 connects to the capacitive sensor ($C_{SNS}$ 62 and $kgV_{AC}$ 60) as well as through the AC signal path to the output VOUT and connects to system ground through the input resistor 67 ($R_{IN}$). Connecting the secondary port's inverting input pin 86 through the DC bias path to output pin $V_{OUT}$ 89 accomplishes the DC restore function (DC bias). The two input ports 81-82 and 85-86 may be configured to have the same gain through the amplifier. When the primary and secondary input ports have the same gain, negative input pins 82 and 86 may have the same noise and offset voltages described above for FIGS. 6B and FIG. 7 for the case when $A_{V2}=-1$. However, it is not necessary that the two input ports match each other and, if they do not, it is possible to trade-off the values of R3 and C3 against noise and $V_{OS}$ in the same manner described previously.

Figure 9A:
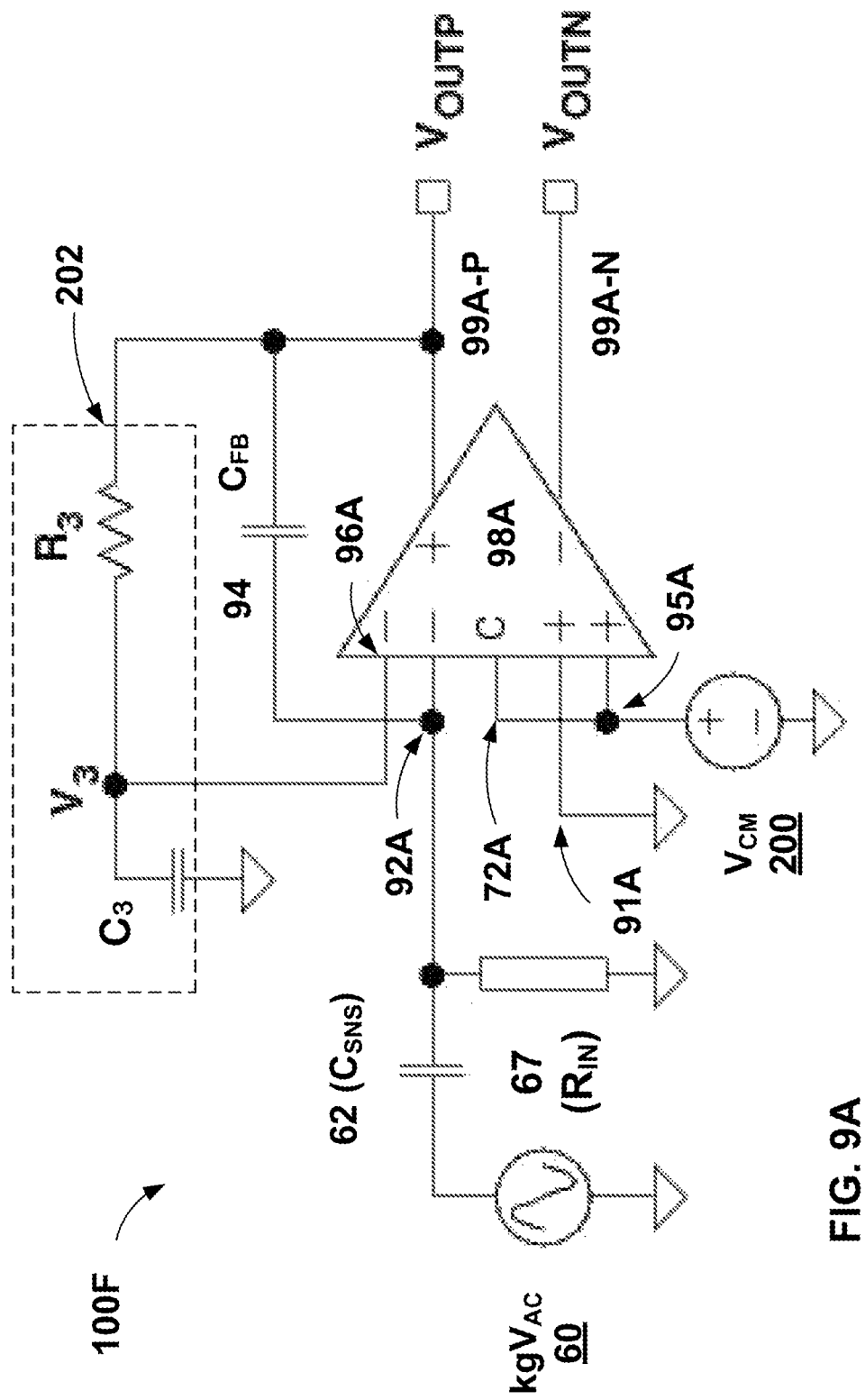
FIG. 9A is a schematic diagram illustrating an example TIA circuit with two differential input ports, a differential output and separate DC bias feedback and AC signal paths.

FIG. 9A is a schematic diagram illustrating an example TIA circuit with and amplifier having two differential input ports, a differential output port and separate DC bias path feedback and AC signal path feedback. The circuit of FIG. 9A is identical to the circuit of FIG. 8 except that it uses an amplifier with a differential output port consisting of a pair of output pins: positive output pin $V_{OUTP}$ 99A-P and negative output pin $V_{OUTN}$ 99A-N.

TIA circuit 100F may include AC sensor bias circuit 60 ($kgV_{AC}$), input capacitor 62, a high impedance input resistor 67 (with resistance $R_{IN}$), differential amplifier (98A), feedback capacitor 94, LPF 202 in the DC bias path, and common mode voltage source 200. Differential amplifier 98A may include an inner (primary) input port and an outer (secondary) input port. In this example, the primary input port may consist of pair of input pins 91A-92A and the secondary input port may consist of a set of input pins 95A-96A. The primary input pins include inverting input port 92A and non-inverting input port 91A, while the secondary input pins include inverting input port 96A and non-inverting input port 95A. The AC signal path may include feedback capacitor 94, with value $C_{FB}$, connected between the positive op amp output 99A-P and the inner port negative input pin 92A, as well as resistor 67, which connects input 92A to ground. The separate DC bias feedback path may include LPF 202, which includes $R_3$ and $C_3$. $R_3$ connects positive output 99A-P to secondary inverting input 96A, while $C_3$ connects inverting input 96A to ground. In the example of circuit 100F common mode voltage source 200 connects both secondary non-inverting input pin 95A and the "C" input 72A to ground.

The "C" input pin 72A may set the common mode output voltage of the $V_{OUTP}$ 99A-P and $V_{OUTN}$ 99A-N pins and may connect to the $V_{CM}$ reference. The "C" input 72A performs the same function as the common mode reference voltage input 72 described above in FIG. 7. As in FIG. 8, the AC signal path connects the primary negative input pin 82 to the output but, in the example of FIG. 9A, connects to the positive output pin $V_{OUTP}$ 99A-P. As described above for FIG. 7, a differential amplifier may avoid the need for a second inverting amplifier in some examples.

Figure 9B:
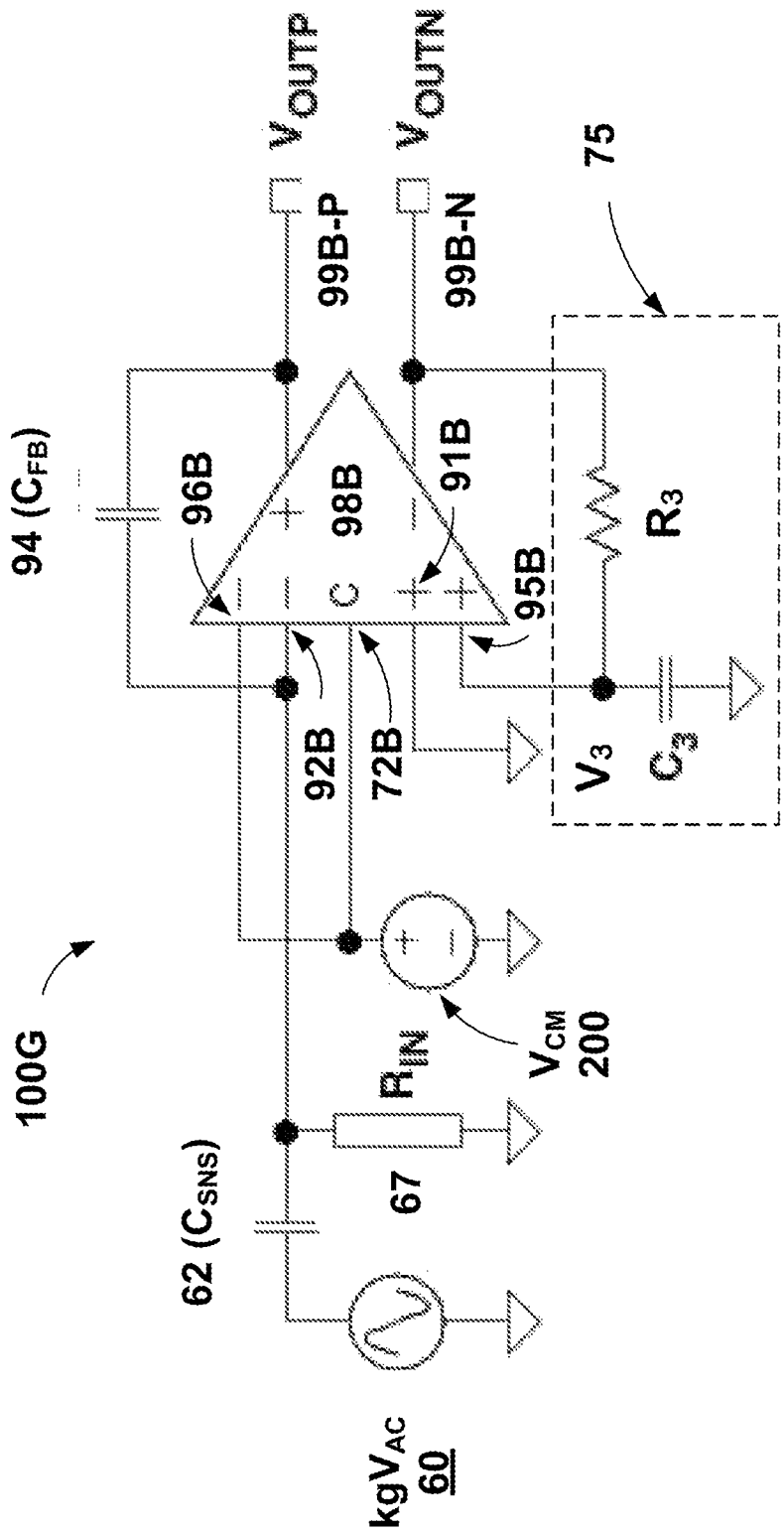
FIG. 9B is a schematic diagram illustrating an additional example of a TIA circuit with two differential input ports and differential output.

FIG. 9B depicts an alternate form of the circuit of FIG. 9A. FIG. 9B is a schematic diagram illustrating an additional example of a TIA circuit using an amplifier with two differential input ports and a differential output port.

TIA circuit 100G may include AC sensor bias circuit 60 (kg$V_{AC}$), input capacitor 62, a high impedance input resistor 67, diff amp 98B, feedback capacitor 94, LPF 75 in the DC bias path, and common mode voltage source 200. Diff amp 98B may include an inner (primary) pair of input pins 91B and 92B, an outer (secondary) set of input pins 95B and 96B. The primary input pins include inverting input pin 92B and non-inverting input pin 91B, while the secondary input pins include inverting input pin 96B and non-inverting input pin 95B. The AC signal path may include feedback capacitor 94, with value $C_{FB}$, connected between the positive diff amp output 99B-P and the inner port negative input pin 92B, as well as $R_{IN}$ (67), which connects input 92B to ground. The separate DC bias feedback path may include LPF 75, which includes $R_3$ and $C_3$. $R_3$ connects negative output 99B-N to secondary non-inverting input 95B, while $C_3$ connects non-inverting input 95B to ground. In the example of circuit 100G common mode voltage source 200 connects both secondary port inverting input 96B and the "C" input 72B to ground.

The "C" input pin 72B may set the common mode output voltage of the $V_{OUTP}$ 99B-P and $V_{OUTN}$ 99B-N pins and may connect to the $V_{CM}$ reference. The "C" input 72B performs the same function as the common mode reference voltage input 72 described above in FIG. 7. As in FIG. 8, the AC signal path connects the primary port negative input 82 to the output but, in the example of FIG. 9B, connects to the positive output pin $V_{OUTP}$ 99B-P. Here, the low-pass filter 75, used for DC restoration, including R3/C3, is the DC bias path that connects the positive secondary input 95B to $V_{OUTN}$ 99B-N rather than to $V_{OUTP}$ pin 99A-P as in FIG. 9A. The circuits of both FIG. 9A and FIG. 9B operate in generally the same manner.

FIG. 10 depicts a third alternate form of the circuits of FIG. 9A and 9B. FIG. 10 is a schematic diagram illustrating an example TIA circuit using a differential amplifier with two differential input ports, a differential output port, and a differential low-pass filter.

TIA circuit 100H may include AC sensor bias circuit 60 (kg$V_{AC}$), input capacitor 62, a high impedance input resistor 67 (with a resistance of $R_{IN}$), differential amp 108, feedback capacitor 104 and common mode voltage source 200. Differential amp 108 may include an inner (primary) pair of input pins 101 and 102, an outer (secondary) set of input pins 105 and 106. The primary input port pins include inverting input pin 102 and non-inverting input pin 101, while the secondary input port include inverting input pin 106 and non-inverting input pin 105. The AC signal path may include feedback capacitor 104, with value $C_{FB}$, connected between the positive diff amp output 109P and the inner port negative input 102, as well as $R_{IN}$ (67), which connects input 102 to ground. In the example of circuit 100H common mode voltage source 200 connects the "C" input 72 to ground and primary non-inverting input 101 connects directly to ground.

Here, a differential low-pass filter including R3, R4, C3, C4, and C5 replaces the single-ended low-pass filter depicted in FIGS. 9A and 9B as R3 and C3. In other words, the differential low-pass filter includes two DC bias paths. The first DC bias path, which includes LPF 202, connects the positive output port $V_{OUTP}$ 109P to the secondary negative input port 106. The second DC bias path connects the negative output Vain. 109N to the secondary positive input port 105. The capacitor, C5 connects the secondary negative input port 106 to the secondary positive input port 105. A potential advantage of this circuit configuration is that the series combination of C3 and C4 can be replaced with a single capacitor C5 having half the value of either C3 or C4 for the same performance. Furthermore, this one capacitor C5 may require only one fourth (¼) of the area required for C3 and C4, when implemented on an integrated circuit (IC). In other words, FIG. 10 may also function as depicted, or (a) with no C5 and C3 and C4 as large capacitors or (b) without C3 and C4 and a smaller C5. However, in practice it may be advantageous to keep at least small values of C3 and C4 in the circuit to remove unwanted common mode signal artifacts. Similar to the circuits above, the AC signal path includes the capacitive sensor model ($C_{SNS}$ 62 and kg$V_{AC}$ 60), primary port negative input pin 102 grounded through $R_{IN}$ 67 and connected to $V_{OUTP}$ 109P through $C_{FB}$ 104. "C" input pin 72 may be used to set the common mode output voltage of the $V_{OUTP}$ 109P and $V_{OUTN}$ 109N pins, and may be tied to $V_{CM}$ 200.

FIG. 11 depicts a schematic diagram illustrating an example TIA circuit connected to a differential low-pass filter and a differential sensor with a differential amplifier having two differential input ports and a differential output port. The example of FIG. 11 may include a dual AC signal path with a second pseudo-resistor 67B between ground and the positive primary (inner) input 111. Two feedback capacitors $C_{FB1}$ and $C_{FB2}$ connect the dual AC signal paths to the outputs $V_{OUTN}$ 119N and $V_{OUTP}$ 119P.

TIA circuit 100J may include AC sensor bias circuit 60 (kg$V_{AC}$), with two input capacitors 62A and 62B, two high impedance input resistors with value $R_{IN}$ (67A and 67B), diff amp 118, two AC signal feedback capacitors $C_{FB1}$ and $C_{FB2}$ and common mode voltage source (shown only as $V_{CM}$ in FIG. 11). Diff amp 118 may include an inner (primary) port and an outer (secondary) port. The primary input port includes inverting input pin 112 and non-inverting input pin 111, while the secondary input port includes inverting input pin 116 and non-inverting input pin 115. The first AC signal path connects between the positive diff amp output 119P and the inner port negative input 112, as well as $R_{IN}$ (67A), which connects input 112 to ground. Similarly, the second AC signal path connects between the negative diff amp output 119N and the inner port positive input 111, as well as input resistor 67B, which connects input 111 to ground. In the example of circuit 100J common mode voltage source $V_{CM}$ connects the "C" input 72 to ground, though for clarity FIG. 11 does not show this connection.

Here, as with FIG. 10, a differential low-pass filter including R3, R4, C3, C4, and C5 replaces the single-ended low-pass filter depicted in FIGS. 9A and 9B as R3 and C3. In other words, the differential low-pass filter includes two DC bias paths. The first DC bias path, with LPF 202, connects the positive output $V_{OUTP}$ 119P to the secondary port negative input 116. The second DC bias path 75 connects the negative output $V_{OUTN}$ 119N to the secondary port positive input 115. The capacitor, C5 connects the secondary port negative input 116 to the secondary port positive input 115.

The example of FIG. 11 includes a dual DC bias path separate from the dual AC signal paths, which operate the same as described above for FIG. 10. Also, $V_{CM}$ connects the "C" input 72 to ground, as described above. The example of FIG. 11 may provide the advantage of connecting a differential capacitive sensor. For example, a differential sensor, depicted as AC bias signal 60 (kgV$_{AC}$) tied to fixed capacitors 62A and 62B with value $C_{SNS}$, connects to the inner input ports of AR1, 111 and 112, as shown in FIG. 11.

Various examples of the disclosure have been described. These and other examples are within the scope of the following claims.

The invention claimed is:

1. A transimpedance amplifier circuit comprising:
   a first input pin and a second input pin;
   one or more output pins;
   an alternating current (AC) coupling that connects the first input pin to the one or more output pins;
   an input resistor that connects the first input pin to a ground; and
   a direct current (DC) bias path separate from the AC coupling that connects the second input pin to the one or more output pins.

2. The transimpedance amplifier circuit of claim 1 further comprising:
   a sensor comprising a sensor output and a sensor input, wherein the sensor output connects to the first input pin and the sensor input connects to a sensor bias circuit.

3. The transimpedance amplifier circuit of claim 2, wherein the sensor comprises a capacitive sensor.

4. The transimpedance amplifier circuit of claim 1, wherein the first input pin comprises a positive input pin and the second input pin comprises a negative input pin.

5. The transimpedance amplifier circuit of claim 1, wherein the first input pin comprises a negative input pin and the second input pin comprises a positive input pin.

6. The transimpedance amplifier circuit of claim 1, wherein the DC bias path comprises at least one low-pass filter stage.

7. The transimpedance amplifier circuit of claim 1, wherein the input resistor is a pseudo-resistor.

8. The transimpedance amplifier circuit of claim 1, wherein the DC bias path comprises an inverting feedback amplifier.

9. The transimpedance amplifier circuit of claim 1, wherein the first input pin comprises a negative input pin and the second input pin comprises a negative input pin; and further comprising:
   a third and fourth input pins, wherein the third input pin comprises a positive input pin connected to ground and the fourth input pin comprises a positive input pin connected to a common mode reference voltage.

10. The transimpedance amplifier circuit of claim 1, further comprising:
    an input to set a common mode output voltage;
    wherein the one or more output pins comprise one or more positive output pins and one or more negative output pins; and wherein:
      the AC coupling connects the first input pin to a positive output pin of the one or more positive output pins; and
      the DC bias path connects the second input pin to a negative output pin of the one or more negative output pins.

11. The transimpedance amplifier of claim 1, wherein the AC coupling blocks DC between the first input pin and the one or more output pins.

12. A transimpedance amplifier circuit comprising:
    an amplifier comprising:
      a first positive input pin and a second positive input pin,
      a first negative input pin and a second negative input pin,
      at least one positive output pin,
      at least one negative output pin, and
      an input to set common mode output voltage; and
    an AC coupling that connects the first negative input pin to the at least one positive output pin.

13. The transimpedance amplifier circuit of claim 12, further comprising an input resistor configured to connect the first negative input pin to ground.

14. The transimpedance amplifier circuit of claim 13, wherein the input resistor is a pseudo-resistor.

15. The transimpedance amplifier circuit of claim 12 further comprising:
    a DC bias path separate from the AC coupling, wherein:
      the DC bias path connects the second negative input pin to the at least one positive output pin, and
      the second positive input pin connects to a common mode reference voltage and to the input to set common mode output voltage.

16. The transimpedance amplifier circuit of claim 12 further comprising:
    a DC bias path separate from the AC coupling, wherein:
      the DC bias path connects the second positive input pin to the at least one negative output pin, and
      the second negative input pin connects to a common mode reference voltage and to the input to set common mode output voltage.

17. The transimpedance amplifier circuit of claim 12 further comprising:
    a first DC bias path and a second DC bias path, wherein the first DC bias path and the second DC bias path are separate from the AC coupling, wherein:
      the first DC bias path connects the second positive input pin to the negative output pin,
      the second DC bias path connects the second negative input pin to the positive output pin,
    a capacitor connecting the second negative input to the second positive input, wherein the capacitor, the first DC bias path and the second DC bias path form a differential low-pass filter, and
    a common mode reference voltage connects to the input to set common mode output voltage.

18. The transimpedance amplifier of claim 17, further comprising:
    a first input resistor configured to connect the first negative input pin to ground;
    a second input resistor configured to connect the first positive input pin to ground, wherein the first negative input and the first positive input are configured as differential inputs.

19. The transimpedance amplifier of claim 18, wherein the first input resistor and the second input resistor is a pseudo-resistor.

20. The transimpedance amplifier circuit of claim 17, wherein the first DC bias path and the second DC bias path comprise at least one low-pass filter stage.

* * * * *